United States Patent
Okuhata (10) Patent No.: US 9,391,814 B2
(45) Date of Patent: Jul. 12, 2016

(54) FM RECEIVER THAT RECEIVES FM SIGNAL AND METHOD FOR RECEIVING FM SIGNAL

(71) Applicant: JVC KENWOOD Corporation, Yokohama-shi (JP)

(72) Inventor: Yasuhide Okuhata, Yokohama (JP)

(73) Assignee: JVC KENWOOD Corporation, Yokohama-shi (JP)

( * ) Notice: Subject to any disclaimer, the term of this patent is extended or adjusted under 35 U.S.C. 154(b) by 0 days.

(21) Appl. No.: 14/622,161

(22) Filed: Feb. 13, 2015

(65) Prior Publication Data
US 2015/0236878 A1 Aug. 20, 2015

(30) Foreign Application Priority Data

Feb. 14, 2014 (JP) .................. 2014-026308
Feb. 14, 2014 (JP) .................. 2014-026309

(51) Int. Cl.
| | |
|---|---|
| *H04B 1/16* | (2006.01) |
| *H04L 25/02* | (2006.01) |
| *H03C 3/09* | (2006.01) |
| *H04L 27/152* | (2006.01) |

(52) U.S. Cl.
CPC .............. *H04L 25/0262* (2013.01); *H03C 3/09* (2013.01); *H04L 27/1525* (2013.01)

(58) Field of Classification Search
CPC .......................... H04B 10/548; H04B 10/5563
USPC .............. 455/205, 307, 130, 142, 334, 23, 42
See application file for complete search history.

(56) References Cited

U.S. PATENT DOCUMENTS

| | | | | |
|---|---|---|---|---|
| 6,725,023 B2* | 4/2004 | Kasperkovitz | ......... | H03D 3/245 375/324 |
| 7,860,479 B2* | 12/2010 | Suzuki | ..................... | H04B 1/10 455/307 |
| 8,055,225 B2* | 11/2011 | Ojima | .................. | H04B 1/1027 455/205 |
| 8,185,082 B2* | 5/2012 | Meijer | ..................... | H04B 1/26 455/276.1 |
| 8,260,233 B2* | 9/2012 | Kobayashi | ........... | H04B 1/1036 455/214 |

FOREIGN PATENT DOCUMENTS

JP          03-016349          1/1991

* cited by examiner

*Primary Examiner* — Sonny Trinh
(74) *Attorney, Agent, or Firm* — Venable LLP; Michael A. Sartori; Todd R. Farnsworth (57) ABSTRACT

A quadrature detector quadrature-detects an FM signal. A first reducer and a second reducer reduce a direct current component included in the FM signal quadrature-detected in the quadrature detector. An FM detector generates a detection signal by FM detecting the FM signal in which the direct current component has been reduced by the first reducer and the second reducer. The offset unit adds an offset to the detection signal generated in the FM detector. An AFC unit generates a control signal for controlling the frequency of a local oscillation signal used in the quadrature detector on the basis of the detection signal to which the offset has been added by the offset unit and feeds back the control signal to a local oscillator that should output the local oscillation signal.

7 Claims, 5 Drawing Sheets

FIG.5 of the present invention.

FM RECEIVER THAT RECEIVES FM SIGNAL AND METHOD FOR RECEIVING FM SIGNAL

CROSS-REFERENCE TO RELATED APPLICATION

This application is based upon and claims the benefit of priority from the prior Japanese Patent Application No. 2014-26308, filed on Feb. 14, 2014 and Japanese Patent Application No. 2014-26309, filed on Feb. 14, 2014, the entire contents of which are incorporated herein by reference.

BACKGROUND

1. Field

The present invention generally relates to a reception technology, and more particularly, to an FM receiver that receives an FM signal and method for receiving an FM signal.

2. Description of the Related Art

An FM (Frequency Modulation) receiver of a direct conversion method changes an RF signal into a baseband signal by quadrature detection and then amplifies the baseband signal by an amplifier. Since an unnecessary direct-current component is output by the amplifier, the FM receiver reduces the direct-current component included in the baseband signal by a coupling capacitor. Further, the FM receiver FM-detects the baseband signal in which the direct-current component has been reduced (for example, see Patent document No. 1).

RELATED ART LIST

Patent Document

[Patent document No. 1] JP 3-16349

When an FM receiver of a direct conversion method is provided with a coupling capacitor, not only an unnecessary direct-current component output by an amplifier is reduced, but also a direct-current component and a low-frequency component of a baseband signal may be reduced. By such reduction, a distortion component is generated after FM detection. Further, if a non-modulated signal is received and the frequency of the received signal is the same as the frequency of a local oscillation signal, a baseband signal thereof includes only a direct-current component, and all the signal is thus cut in the coupling capacitor. As a result, only noise received by an antenna and noise generated inside are FM detected, and a signal after the FM detection contains only noise.

SUMMARY

In this background, a purpose of the present invention is to provide a technology for improving the quality of an FM-detected signal.

An FM receiver according to one embodiment of the present invention includes: a quadrature detection device that quadrature-detects an FM signal; a reducer that reduces a direct current component included in the FM signal quadrature-detected in the quadrature detection device; an FM detector that generates a detection signal by FM detecting the FM signal in which the direct current component has been reduced by the reducer; an offset unit that adds an offset to the detection signal generated by the FM detector; and an Automatic Frequency Control (AFC) unit that generates a control signal for controlling the frequency of a local oscillation signal used in the quadrature detection device on the basis of the detection signal to which the offset has been added by the offset unit and feeds back the control signal to a local oscillator that should output the local oscillation signal.

Another embodiment of the present invention also relates to an FM receiver. The FM receiver includes: a quadrature detection device that quadrature-detects an FM signal; a reducer that reduces a direct current component included in the FM signal quadrature-detected in the quadrature detection device; an FM detector that generates a detection signal by FM detecting the FM signal in which the direct current component has been reduced by the reducer; a first local oscillator that outputs a first local oscillation signal; a second local oscillator that outputs, to the quadrature detector, a second local oscillation signal frequency-modulated by the first local oscillation signal output from the first local oscillator; and an addition unit that adds the first local oscillation signal from the first local oscillator and the detection signal generated in the FM detector.

Still another embodiment of the present invention relates to a method for receiving an FM signal. The method includes: quadrature-detecting an FM signal; reducing a direct current component included in the FM signal that has been quadrature-detected; generating a detection signal by FM detecting the FM signal in which the direct current component has been reduced; adding an offset to the detection signal that is generated; and generating a control signal for controlling the frequency of a local oscillation signal used in the quadrature-detecting on the basis of the detection signal to which the offset has been added, and feeding back the control signal to a local oscillator that should output the local oscillation signal.

Still another embodiment of the present invention also relates to a method for receiving an FM signal. The method for receiving an FM signal includes: quadrature-detecting an FM signal; reducing a direct current component included in the FM signal that has been quadrature-detected; generating a detection signal by FM detecting the FM signal in which the direct current component has been reduced; outputting a first local oscillation signal; outputting, for the quadrature detection, a second local oscillation signal frequency-modulated by the first local oscillation signal; and adding the first local oscillation signal and the detection signal.

Optional combinations of the aforementioned constituting elements and implementations of the invention in the form of methods, apparatuses, systems, recording mediums, and computer programs may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION

The invention will now be described by reference to the preferred embodiments. This does not intend to limit the scope of the present invention, but to exemplify the invention.

First Embodiment

A brief description of the present invention will be given first before a specific description thereof. A first embodiment of the present invention relates to an FM receiver of a direct conversion type. By placing a coupling capacitor between a quadrature detection device and an FM detection device, a direct-current component is reduced, and deviation in the Cartesian coordinates is thus reduced. However, convergence of a frequency difference between a received signal and a local oscillation signal to zero by AFC when a non-modulated signal is received causes quadrature detection output to stop at one point on a coordinate circle, and the level of a signal that is input to the FM detection device is attenuated such that the level becomes close to the vicinity of the origin. Since the amount of change in phase rotation is output in Arctan detection performed in the FM detection device, phase rotation due to irregular noise is detected when input entries concentrate in the vicinity of the origin. As a result, the result of the FM detection indicates noise. On the other hand, when a received signal is non-modulated, the result of FM detection should indicate silence. Further, since the output frequency of a local oscillator varies due to temperature or the like, conditions for generating noise change due to temperature. Further, since no non-modulated transmission occurs in digital (four-valued Frequency Shift Keying: FSK), what is described previously is a problem in analog FM, which can be used in non-modulated transmission.

The present embodiment is directed to reduce, by a direct conversion method, distortion generated after FM detection in a receiver that performs FM detection after reducing a direct-current component of a baseband signal. This can be also considered as achievement of a stable operation even when a non-modulated signal is received. In the embodiment, in order not to stop the rotation of the quadrature detection output, a frequency difference is converged to an offset value instead of setting a convergence target thereof by AFC to be zero.

Figure 1:
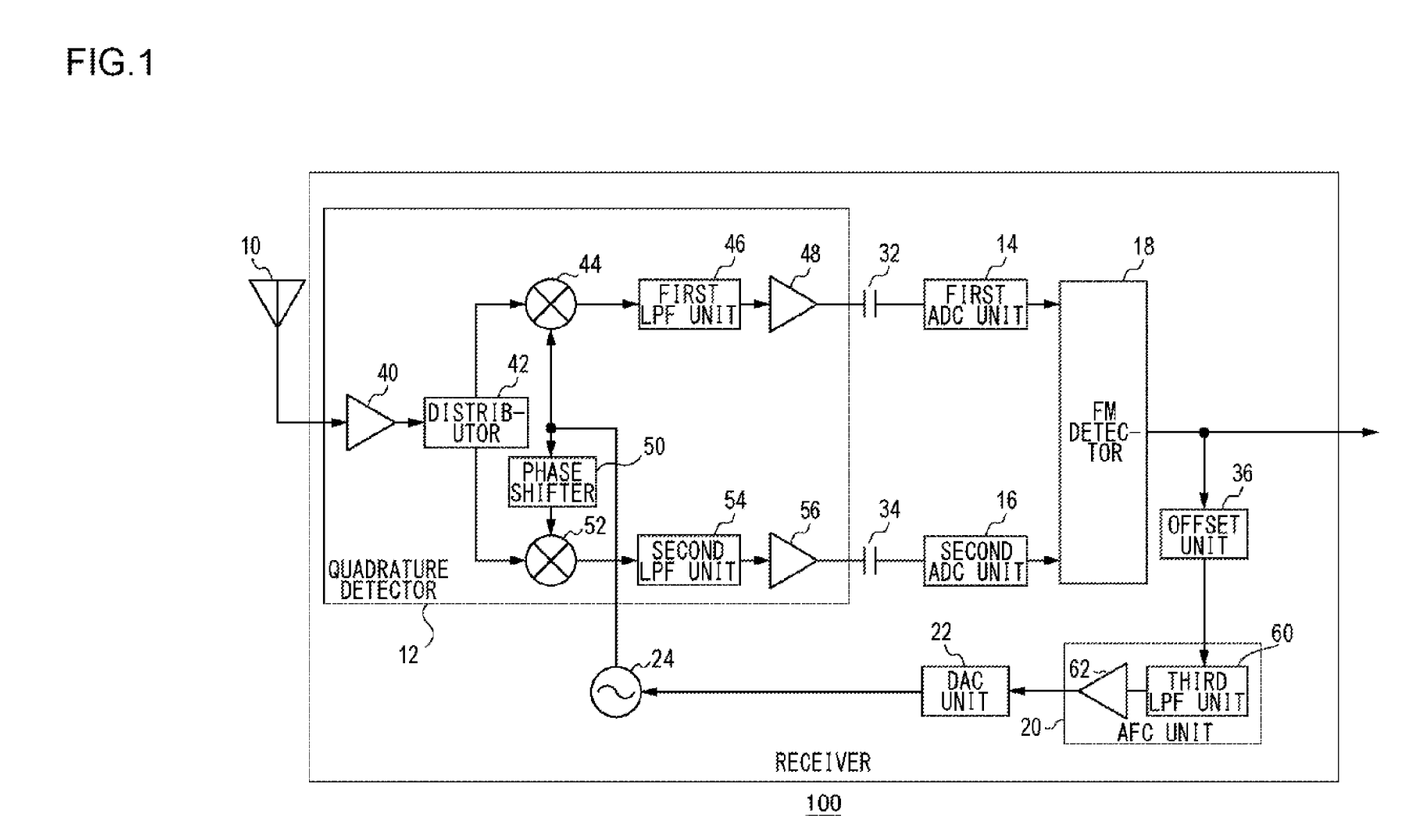
FIG. 1 is a diagram illustrating the configuration of a receiver according to a first embodiment of the present invention.

FIG. 1 illustrates the configuration of a receiver 100 according to a first embodiment of the present invention. The receiver 100 includes an antenna 10, a quadrature detector 12, a first reducer 32, a second reducer 34, a first ADC unit 14, a second ADC unit 16, an FM detector 18, an offset unit 36, an AFC unit 20, a DAC unit 22, and a local oscillator 24. The quadrature detector 12 includes a first amplifier 40, a distributor 42, a first mixer 44, a first LPF unit 46, a second amplifier 48, a phase shifter 50, a second mixer 52, a second LPF unit 54, and a third amplifier 56. The AFC unit 20 includes a third LPF unit 60 and a fourth amplifier 62.

The antenna 10 receives a Radio Frequency (RF) signal from a transmitter (not shown). The RF signal has been frequency-modulated. The antenna 10 outputs the received RF signal to the first amplifier 40. The first amplifier 40 is a Low Noise Amplifier (LNA) and amplifies the RF signal from the antenna 10. The first amplifier 40 outputs the amplified RF signal to the distributor 42. The distributor 42 splits the RF signal from the first amplifier 40 into two signals. The distributor 42 outputs the split RF signals to the first mixer 44 and the second mixer 52, respectively.

The local oscillator 24 adjusts the frequency of a local oscillation signal in accordance with a control signal from the DAC unit 22 and outputs the local oscillation signal, whose frequency has been adjusted, to the first mixer 44 and the phase shifter 50. During this adjustment, the local oscillator 24 increases the frequency of the local oscillation signal as the voltage of the control signal becomes higher. The phase shifter 50 shifts the phase of the local oscillation signal from the local oscillator 24 by 90 degrees. The phase shifter 50 outputs the local oscillation signal, whose phase has been shifted, to the second mixer 52.

The first mixer 44 generates an in-phase component signal of a baseband (hereinafter, referred to as an "I signal") by multiplying the RF signal from the distributor 42 by the local oscillation signal from the local oscillator 24. The first mixer 44 outputs the I signal to the first LPF unit 46. The second mixer 52 generates a quadrature component signal of a baseband (hereinafter referred to as a "Q signal") by multiplying the RF signal from the distributor 42 by the local oscillation signal from the phase shifter 50. The second mixer 52 outputs the Q signal to the second LPF unit 54.

The first LPF unit 46 performs band limitation by filtering out, from I signals that are output from the first mixer 44, signals whose frequency is equal to or higher than a cutoff frequency. The first LPF unit 46 outputs an I signal of a low-frequency component (hereinafter this is also referred to as an "I signal") to the second amplifier 48. The second LPF unit 54 performs band limitation by filtering out, from Q signals that are output from the second mixer 52, signals whose frequency is equal to or higher than a cutoff frequency. The second LPF unit 54 outputs a Q signal of a low-frequency component (hereinafter this component is also referred to as a "Q signal") to the third amplifier 56. The second amplifier 48 amplifies the I signal from the first LPF unit 46 and outputs the amplified I signal to the first reducer 32. The third amplifier 56 amplifies the Q signal from the second LPF unit 54 and outputs the amplified Q signal to the second reducer 34. The I signal output from the second amplifier 48 includes an unnecessary direct-current component, and the Q signal output from the third amplifier 56 also includes an unnecessary direct-current component. As described above, the quadrature detector 12 quadrature-detects an RF signal. Also, the quadrature detector 12 consists of an analog device, and is implemented, for example, on one chip.

The first reducer 32 receives the I signal from the second amplifier 48. The first reducer 32 consists of, for example, a coupling capacitor and reduces a direct-current component included in the I signal. The first reducer 32 outputs the I signal in which the direct-current component has been reduced (hereinafter, this is also referred to as an "I signal") to the first ADC unit 14. The second reducer 34 receives the Q signal from the third amplifier 56. As in the case of the first reducer 32, the second reducer 34 also consists of a coupling capacitor and reduces a direct-current component included in the Q signal. The second reducer 34 outputs the Q signal in which the direct-current component has been reduced (hereinafter, this is also referred to as a "Q signal") to the second ADC unit 16.

The first ADC unit 14 performs analog-digital conversion on the I signal from the first reducer 32. The first ADC unit 14 outputs the I signal, which has been converted into a digital signal, (hereinafter, the resultant signal is also referred to as an "I signal") to the FM detector 18. The second ADC unit 16 performs analog-digital conversion on the Q signal from the second reducer 34. The second ADC unit 16 outputs the Q signal, which has been converted into a digital signal, (hereinafter, the resultant signal is also referred to as a "Q signal") to the FM detector 18.

The FM detector 18 FM-detects the I signal and the Q signal, i.e., baseband signals. As the FM detection, for example, Arctan detection is performed. In the Arctan detection, each of the I signal and the Q signal is assumed to be two sides of a triangle, and an angle therebetween is derived. A change in an angle per unit time corresponds to an angular velocity (i.e., a frequency), thus allowing for demodulation of frequency modulation. The FM detector 18 outputs a detection signal, which is the result of the FM detection. The detection signal that is output corresponds to an audio signal.

The offset unit 36 adds an offset to the detection signal generated in the FM detector 18. This corresponds to addition of an offset value to the detection signal. In the absence of the offset unit 36, the center frequency of an RF signal and the frequency of a local oscillation signal are controlled to be the same by the AFC unit 20. However, since the offset unit 36 adds a constant offset value, the local oscillation signal has a frequency offset according to the offset value. When this frequency offset is set to be a frequency that is not reduced in the first reducer 32 or the second reducer 34, the I signal and the Q signal have a frequency that is the same as that of the frequency offset without having a direct-current component even when the RF signal is non-modulated. Therefore, even when a non-modulated RF signal is input, a detection signal does not turn into noise.

The third LPF unit 60 performs a low-pass-filtering process on the detection signal generated in the FM detector 18. This corresponds to derivation of an average value of the detection signal. Therefore, in the third LPF unit 60, a direct-current component of a detection signal (i.e., a frequency difference between an RF signal and a local oscillation signal) is detected. The fourth amplifier 62 generates a control signal by amplifying a signal from the third LPF unit 60. The amplification in the fourth amplifier 62 determines the gain of an AFC loop. In this manner, the AFC unit 20 generates a control signal for controlling the frequency of a local oscillation signal to be used in quadrature detection on the basis of the detection signal to which the offset has been added by the offset unit 36.

The DAC unit 22 performs digital-analog conversion on a control signal from the fourth amplifier 62 and outputs the control signal, which is an analog signal, (hereinafter, also referred to as a "control signal") to the local oscillator 24. That is, the AFC unit 20 feeds back the control signal to the local oscillator 24 that should output a local oscillation signal.

The configurations, from hardware aspect, can be achieved with an arbitrary computer CPU, memory, and other LSIs, and from software aspect, the configurations can be achieved with, for example, a program loaded in memory, and a functional block achieved by the solidarity of those components is shown here. Thus, a person skilled in the art should appreciate that there are many ways of accomplishing these functional blocks in various forms in accordance with the components of hardware only, software only, or the combination of both.

According to the present embodiment, an offset is added to a detection signal, and a risk where all the baseband signal is cut even when a non-modulated signal is input can thus be suppressed. Since the risk where all the baseband signal is cut can be suppressed, a situation can be avoided where FM detection output becomes noise only as in the case where an RF signal is not being received. Also, since the situation can be avoided where FM detection output becomes noise only, the quality of an FM-detected signal can be improved. Further, since the offset value of the local oscillator is changed before and after the input of an RF signal, the suppression of the reduction in a baseband signal at the time of the input of the RF signal and the suppression of the subsequent deterioration of reception characteristics such as adjacent interference can be both achieved. The reduction of a baseband signal in succession by a reducer can be suppressed when a non-modulated signal is input. Since the frequency of a local oscillation signal is varied until the detection of an RF signal, the reduction of a baseband signal in succession by a reducer can be suppressed.

Second Embodiment

Subsequently, a second embodiment will be described. The second embodiment of the present invention also relates to an FM receiver that is a direct conversion type and that has a coupling capacitor placed between a quadrature detection device and an FM detection device, as in the case of the first embodiment. The amplitude of a baseband signal may be attenuated if the frequency of the baseband signal is lowered due to the insertion of a coupling capacitor. More specifically, in a frequency transition of a received frequency-modulated wave, the frequency of a baseband signal that is output from the quadrature detection device becomes close to that of the direct current near where the frequency of a received signal and the frequency of the local oscillator become identical with each other. In such a condition, the level of the baseband signal is lowered by the coupling capacitor. The suppression of such a condition from happening is the purpose of the second embodiment. The FM receiver according to the second embodiment interpolates a detection signal when the level of the baseband signal is attenuated.

Figure 2:
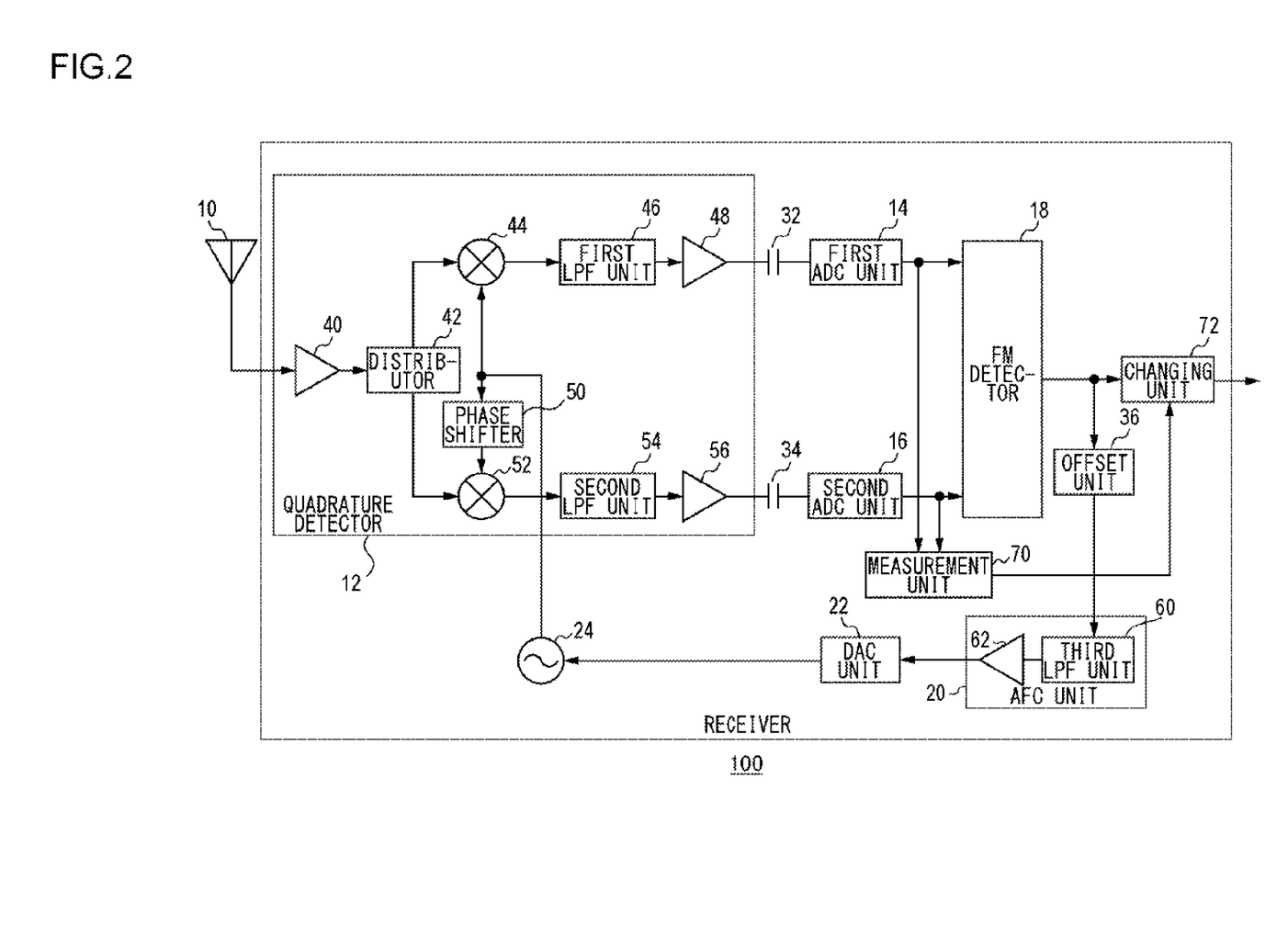
FIG. 2 is a diagram illustrating the configuration of a receiver according to a second embodiment of the present invention.

FIG. 2 illustrates the configuration of a receiver 100 according to the second embodiment of the present invention. The receiver 100 has a configuration where a measurement unit 70 and a changing unit 72 are added to the configuration in FIG. 1. A description will be made mainly regarding the difference from FIG. 1. As previously described, when a non-modulated signal is input in FIG. 2, a baseband signal passes through a first reducer 32 and a second reducer 34. On the other hand, when a modulated signal is input, a signal component is also reduced in the first reducer 32 and the second reducer 34 when the frequency of the baseband signal becomes close to that of the direct current, and distortion and noise are generated upon the FM detection of the signal component.

The measurement unit 70 receives an I signal from the first reducer 32 and also receives a Q signal from the second reducer 34. The measurement unit 70 measures the level of the baseband signal based on the I signal and the Q signal that are input. For the measurement of the level, publicly-known techniques can be used. Thus, the explanation thereof is omitted. The measurement unit 70 outputs the measured level to the changing unit 72. The changing unit 72 receives a detection signal from an FM detector 18 and also receives the level from the measurement unit 70. The changing unit 72 compares a pre-stored threshold value and the level. When the level is smaller than the threshold value, the changing unit 72 makes a correction such as changing the detection signal to that of another value, for example, a detection signal of the past for outputting. In such a case, it is assumed that there are a lot of distortion and noise in a detection signal, and control is performed such that the detection signal at that time is not output. The detection signal of the past means a detection signal occurring when the level measured in the measurement unit 70 is the threshold value or more.

According to the present embodiment, even when a baseband signal temporarily becomes close to a direct-current component and reduced by a reducer, the outputting of a signal obtained after performing FM detection thereon is stopped, and distortion and noise of a signal to be output can thus be reduced. Also, since the distortion and noise of the signal to be output is reduced, the quality of the signal can be improved.

Third Embodiment

Subsequently, a third embodiment will be described. The third embodiment of the present invention also relates to an FM receiver that is a direct conversion type and that has a coupling capacitor placed between a quadrature detection device and an FM detection device, as in the case of the previous embodiments. In particular, an RF signal that is received corresponds to a signal for tone squelch. Further, when a frequency difference between an RF signal and a local oscillation signal is large in an initial state where the reception of the RF signal is started, an AFC unit controls the local oscillation signal, thus varying an average value of values that are output from an FM detector. In that case, if a Continuous Tone Coded Squelch System (CTCSS) or a Digital-Coded Squelch (DCS) is included in the RF signal, signal detection is affected.

In order to deal therewith, an FM receiver according to the third embodiment controls the frequency of a local oscillator by executing AFC on the basis of an FM detection signal and adds a control signal of the AFC to the FM detection signal. This addition increases a control signal component, which has been attenuated.

Figure 3:
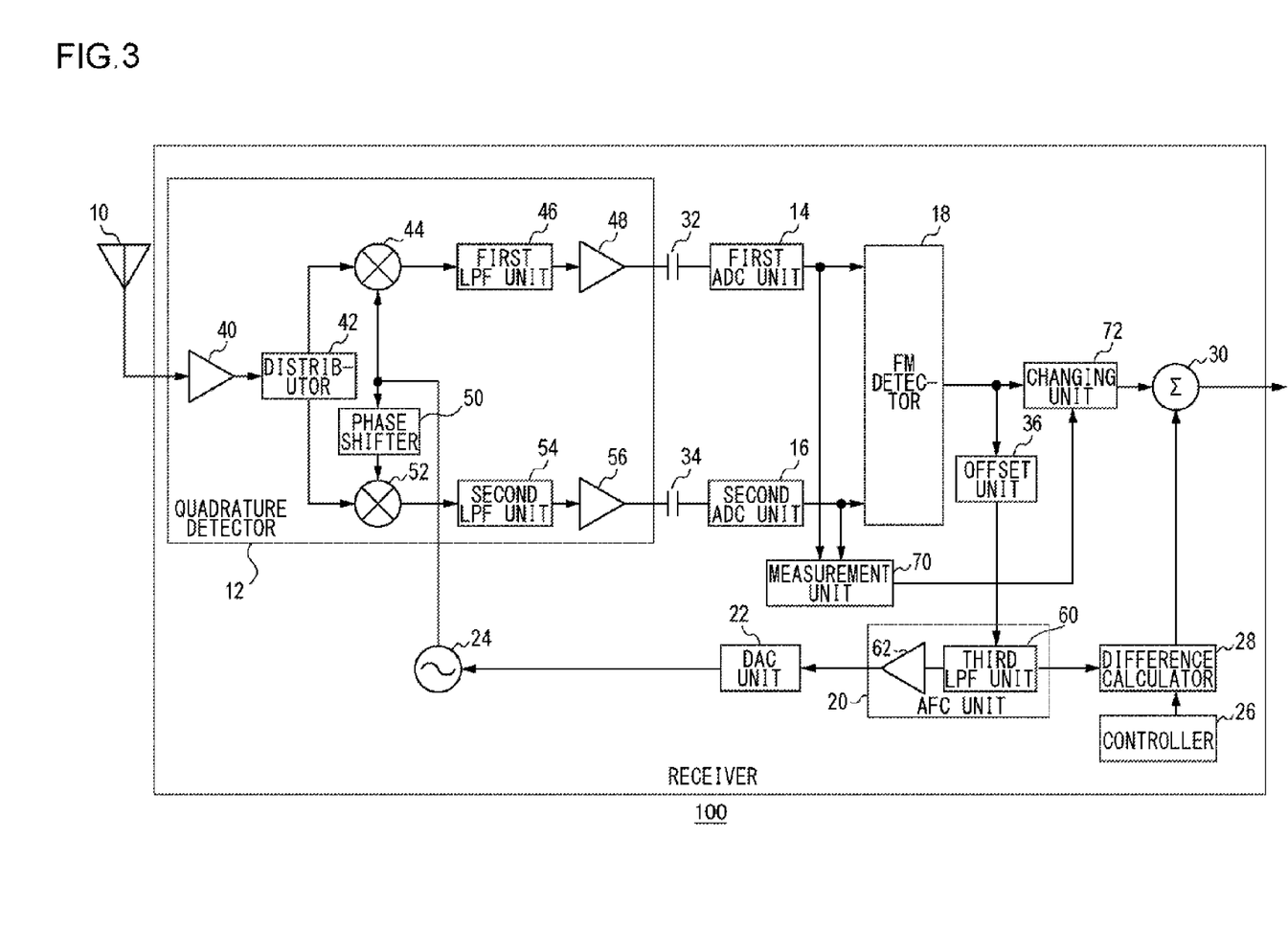
FIG. 3 is a diagram illustrating the configuration of a receiver according to a third embodiment of the present invention.

FIG. 3 illustrates the configuration of a receiver 100 according to the third embodiment of the present invention. The receiver 100 has a configuration where a controller 26, a difference calculator 28, and an addition unit 30 are added to FIG. 2. A description will be made mainly regarding the difference from FIG. 2.

The controller 26 detects a time point when the power of the receiver 100 is turned on and a time point when the receiver 100 starts receiving an RF signal. These time points are generically referred to as "start timing." Since publicly-known techniques can be used for the detection of start timing, the explanation thereof is omitted. The controller 26 notifies the difference calculator 28 of the start timing of a process. As described, the controller 26 controls the operation of the difference calculator 28.

The difference calculator 28 receives a signal from a third LPF unit 60, i.e., a detection signal on which a low-pass-filtering process is performed in the third LPF unit 60. At the start timing of the process notified by the controller 26, the difference calculator 28 acquires and stores a detection signal on which a low-pass-filtering process is performed in the third LPF unit 60 as a reference value. After having stored the reference value, the difference calculator 28 sequentially generates, as a difference signal, a difference between the detection signal, on which the low-pass-filtering process is performed in the third LPF unit 60, and the reference value. That is, the difference calculator 28 generates a difference signal representing a difference from the reference value on the basis of the detection signal generated in an FM detector 18. The difference calculator 28 outputs the difference signal to the addition unit 30.

The addition unit 30 adds the difference signal generated in the difference calculator 28 and a detection signal from a changing unit 72. This corresponds to operation of canceling output voltage variation of the FM detector 18 by the AFC unit 20.

Figure 4:
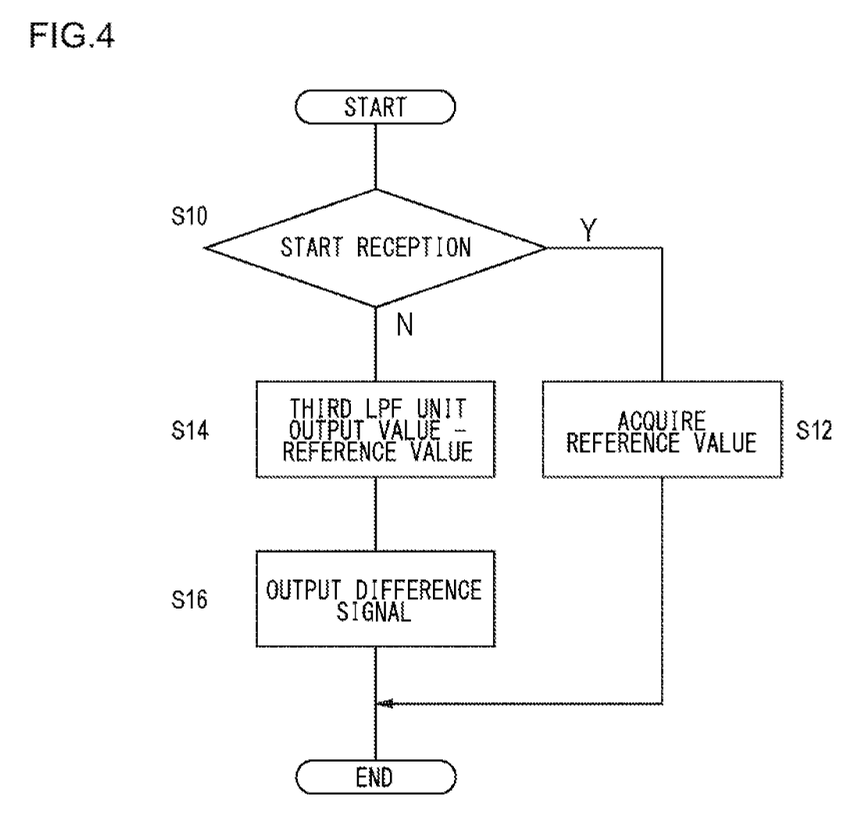
FIG. 4 is a flowchart illustrating a reception procedure performed by the receiver shown in FIG. 3.

An explanation on the operation of a receiver 100 with the aforementioned configuration will be given below. FIG. 4 shows a flowchart indicating a reception procedure performed by the receiver 100. If a controller 26 detects the start of reception (Y in S10), a difference calculator 28 acquires a reference value (S12). If the controller 26 does not detect the start of reception (N in S10), the difference calculator 28 generates a difference signal by calculating the subtraction of the reference value from an output value of a third LPF unit 60 (S14). The difference calculator 28 outputs the difference signal (S16).

According to the present embodiment, since the difference between a detection signal on which a low-pass-filtering process is performed and a reference value is added to a detection signal, attenuation of a signal for tone squelch can be suppressed. Further, since a detection signal at start timing of a process, on which a low-pass-filtering process is performed, is stored as a reference value, accuracy of processing can be improved. Further, as a measure against attenuation and/or distortion of a signal for tone squelch after FM detection due to tracking of the signal for tone squelch by the AFC in case that the signal for tone squelch is included in an RF signal, a difference signal is added. Therefore, the signal for tone squelch can be recovered. Further, since the signal for tone squelch is recovered, squelch operation can be performed normally. Further, since variation in a signal after the FM detection that is generated by the AFC is reduced, deterioration in detection performance for a tone squelch signal can be suppressed.

Fourth Embodiment

Subsequently, a fourth embodiment will be described. The fourth embodiment of the present invention also relates to an FM receiver that is a direct conversion type and that has a coupling capacitor placed between a quadrature detection device and an FM detection device, as in the case of the previous embodiments. The fourth embodiment corresponds to a configuration that does not include an AFC.

Figure 5:
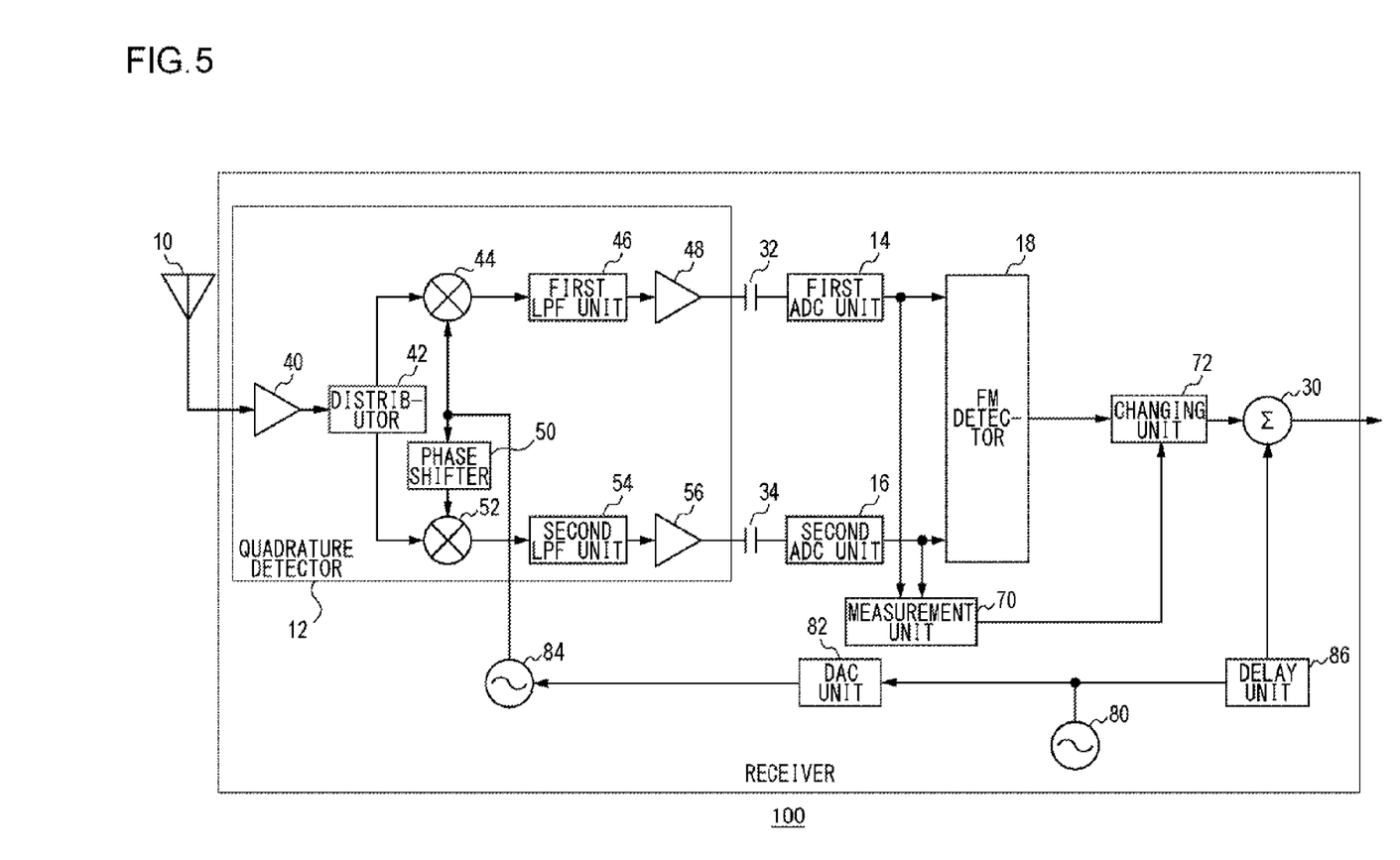
FIG. 5 is a diagram illustrating the configuration of a receiver according to a forth embodiment of the present invention.

FIG. 5 illustrates the configuration of a receiver 100 according to the fourth embodiment of the present invention. The receiver 100 includes an antenna 10, a quadrature detector 12, a first reducer 32, a second reducer 34, a first ADC unit 14, a second ADC unit 16, an FM detector 18, a measurement unit 70, a changing unit 72, an addition unit 30, a first local oscillator 80, a DAC unit 82, a second local oscillator 84, and a delay unit 86. The quadrature detector 12 includes a first amplifier 40, a distributor 42, a first mixer 44, a first LPF unit 46, a second amplifier 48, a phase shifter 50, a second mixer 52, a second LPF unit 54, and a third amplifier 56. A description will be made mainly regarding the difference from the previous figures.

The first local oscillator 80 outputs a first local oscillation signal. The first local oscillation signal is a digital signal. The DAC unit 82 performs digital-analog conversion on the first local oscillation signal from the first local oscillator 80 and then outputs the first local oscillation signal, which is an analog signal, (hereinafter also referred to as a "first local oscillation signal") to the second local oscillator 84.

The second local oscillator 84 adjusts the frequency of a second local oscillation signal in accordance with the first local oscillation signal from the DAC unit 82 and outputs the second local oscillation signal, whose frequency has been adjusted, to the first mixer 44 and the phase shifter 50. This corresponds to outputting, to the quadrature detector 12, the second local oscillation signal frequency-modulated by the first local oscillation signal output from the first local oscillator 80.

The delay unit 86 delays the first local oscillation signal from the first local oscillator 80. The delay time corresponds to the period of processing required from the DAC unit 82, the second local oscillator 84, and the quadrature detector 12 to the changing unit 72. The delay unit 86 outputs the delayed first local oscillation signal (hereinafter, also referred to as a "first local oscillation signal") to the addition unit 30. The addition unit 30 receives a detection signal from the changing unit 72 and also receives the first local oscillation signal from the delay unit 86. The addition unit 30 adds the first local oscillation signal and the detection signal.

According to the present embodiment, since a second local oscillation signal is frequency-modulated, the reduction of a baseband signal in succession by a reducer can be suppressed. Further, since the frequency of a first local oscillation signal from a first local oscillator is set to be lower than a frequency in a voice band, the reduction of a baseband signal in succession by a reducer can be suppressed even when a modulated signal is input. Even when a baseband signal temporarily becomes close to a direct current component and reduced by a reducer, the outputting of an FM-detected signal is corrected, as in the case of the second embodiment, and distortion and noise of a detection signal can thus be reduced.

Described above is an explanation based on the embodiments of the present invention. These embodiments are intended to be illustrative only, and it will be obvious to those skilled in the art that various modifications to constituting elements and processes could be developed and that such modifications are also within the scope of the present invention.

In the present embodiments 2 through 4, a changing unit 72 is placed at a part where a detected signal is output from an FM detector 18. However, the example given is non-limiting. For example, one changing unit 72 may be placed between a first ADC unit 14 and an FM detector 18, and another changing unit 72 may be placed between a second ADC unit 16 and the FM detector 18. The former changing unit 72 changes an I signal, and the latter changing unit 72 changes a Q signal. According to the present variation, the degree of freedom in designing can be improved. In the third and fourth embodiments, a measurement unit 70 and a changing unit 72 may be omitted. In that case, the configuration of a device can be simplified.

What is claimed is:

1. An FM receiver comprising:
   a quadrature detection device that quadrature-detects an FM signal;
   a reducer that reduces a direct current component included in the FM signal quadrature-detected in the quadrature detection device;
   an FM detector that generates a detection signal by FM detecting the FM signal in which the direct current component has been reduced by the reducer;
   an offset unit that adds an offset to the detection signal generated by the FM detector; and
   an Automatic Frequency Control (AFC) unit that generates a control signal for controlling the frequency of a local oscillation signal used in the quadrature detection device on the basis of the detection signal to which the offset has been added by the offset unit and feeds back the control signal to a local oscillator that should output the local oscillation signal.

2. The FM receiver according to claim 1, further comprising:
   a measurement unit that measures the level of the FM signal in which the direct current component has been reduced by the reducer; and
   a changing unit that changes, when the level measured in the measurement unit is smaller than a threshold value, the FM signal in which the direct current component has been reduced by the reducer or the detection signal generated in the FM detector to have another value for outputting.

3. The FM receiver according to claim 1, further comprising:
   a difference calculator that generates a difference signal representing a difference from a reference value on the basis of the detection signal generated in the FM detector; and
   an addition unit that adds the difference signal generated in the difference calculator and the detection signal generated in the FM detector.

4. The FM receiver according to claim 1, wherein the offset unit outputs to the AFC unit a predetermined value instead of the detection signal when an FM signal is not being detected in the quadrature detection device.

5. An FM receiver comprising:
   a quadrature detection device that quadrature-detects an FM signal;
   a reducer that reduces a direct current component included in the FM signal quadrature-detected in the quadrature detection device;
   an FM detector that generates a detection signal by FM detecting the FM signal in which the direct current component has been reduced by the reducer;
   a first local oscillator that outputs a first local oscillation signal;
   a second local oscillator that outputs, to the quadrature detector, a second local oscillation signal frequency-modulated by the first local oscillation signal output from the first local oscillator; and
   an addition unit that adds the first local oscillation signal from the first local oscillator and the detection signal generated in the FM detector.

6. The FM receiver according to claim 5, further comprising:
   a measurement unit that measures the level of the FM signal in which the direct current component has been reduced by the reducer; and
   a changing unit that changes, when the level measured in the measurement unit is smaller than a threshold value, the FM signal in which the direct current component has been reduced by the reducer or the detection signal generated in the FM detector to have another value for outputting.

7. A method for receiving an FM signal comprising:
   quadrature-detecting an FM signal;
   reducing a direct current component included in the FM signal that has been quadrature-detected;
   generating a detection signal by FM detecting the FM signal in which the direct current component has been reduced;
   outputting a first local oscillation signal;
   outputting, for the quadrature detection, a second local oscillation signal frequency-modulated by the first local oscillation signal; and
   adding the first local oscillation signal and the detection signal.

* * * * *